United States Patent
Zhang et al.

(10) Patent No.: US 10,535,701 B2
(45) Date of Patent: Jan. 14, 2020

(54) PLASMONIC-NANOSTRUCTURE SENSOR PIXEL

(71) Applicant: OmniVision Technologies, Inc., Santa Clara, CA (US)

(72) Inventors: Boyang Zhang, San Jose, CA (US); Chin Poh Pang, Pleasanton, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/993,472

(22) Filed: Jan. 12, 2016

(65) Prior Publication Data

US 2017/0200760 A1     Jul. 13, 2017

(51) Int. Cl.
  *H01L 27/146*     (2006.01)
  *B82Y 20/00*     (2011.01)

(52) U.S. Cl.
  CPC .... *H01L 27/14649* (2013.01); *H01L 27/1462* (2013.01); *H01L 27/14621* (2013.01); *H01L 27/14627* (2013.01); *B82Y 20/00* (2013.01); *Y10S 977/773* (2013.01); *Y10S 977/81* (2013.01); *Y10S 977/954* (2013.01)

(58) Field of Classification Search
  CPC ............ H01L 27/146; H01L 27/14649; H01L 27/14621
  USPC ......................................................... 257/70
  See application file for complete search history.

(56) References Cited

U.S. PATENT DOCUMENTS

| 7,538,405 B2 | 5/2009 | Gruhlke et al. |
| 8,816,358 B1 | 8/2014 | Tsai et al. |
| 8,866,950 B2 | 10/2014 | Yokogawa |
| 2009/0250594 A1* | 10/2009 | Tanaka .................. G02B 5/201 250/208.1 |
| 2010/0149396 A1* | 6/2010 | Summa ............. H01L 27/14621 348/311 |
| 2011/0116168 A1 | 5/2011 | Nikoobakht |

(Continued)

FOREIGN PATENT DOCUMENTS

TW     201515205 A     4/2015

OTHER PUBLICATIONS

Berger, Novel Nanosphere Lithography to Fabricate Tunable Plasmonic Metasurfaces; Nano Werk, Jun. 18, 2015, 7 pages.

(Continued)

*Primary Examiner* — Bo Fan
(74) *Attorney, Agent, or Firm* — Lathrop Gage LLP

(57) ABSTRACT

A first plasmonic-nanostructure sensor pixel includes a semiconductor substrate and a plurality of metal pillars. The semiconductor substrate has a top surface and a photodiode region therebeneath. The plurality of metal pillars is at least partially embedded in the substrate and extends from the top surface in a direction substantially perpendicular to the top surface. A second plasmonic-nanostructure sensor pixel includes (a) a semiconductor substrate having a top surface, (b) an oxide layer on the top surface, (c) a thin-film coating between the top surface and the oxide layer, and (d) a plurality of metal nanoparticles (i) at least partially between the top surface and the oxide layer and (ii) at least partially embedded in at least one of the thin-film coating and the oxide layer. A third plasmonic-nanostructure sensor pixel includes features of both the first and second plasmonic-nanostructure sensor pixels.

21 Claims, 9 Drawing Sheets

(56) References Cited

U.S. PATENT DOCUMENTS

2012/0061553 A1 3/2012 Yokogawa
2012/0298843 A1 11/2012 Yu et al.
2014/0146207 A1 5/2014 Yokogawa
2014/0291479 A1 10/2014 Lu et al.

OTHER PUBLICATIONS

Beye et al., Antireflection Coatings Combining Silicon Nitride with Silicon Nanoparticles, JERIT, Jun. 2014, vol. 1, Issue 2, 6 pages.
Burgos et al., Color Imaging via Nearest Neighbor Hole Coupling in Plasmonic Color Filters Integrated onto a Complementary Metal-Oxide Semiconductor Image Sensor, ACSNANO, vol. 7, No. 11, 2013, 10 pages.
Caro et al., Silver Nanoparticles: Sensing and Imaging Applications, InTech, Mar. 1, 2010, 24 pages.
Chen F. et al., Light Trapping Design in Silicon-Based Solar Cells, InTech, Nov. 2, 2011, 21 pages.
Chen H. et al., Shape- and Size-Dependent Refractive Index Sensitivity of Gold Nanoparticles, Langmuir, Apr. 25, 2008, vol. 24, No. 10, 10 pages.
Chen Q. et al. A CMOS Image Sensor Integrated with Plasmonic Colour Filters, Plasmonics, Mar. 27, 2012, 5 pages.
Chen Q. et al., CMOS Photodetectors Integrated With Plasmonic Color Filters, IEEE Photonics Technology Letters, vol. 24, No. 3, Feb. 1, 2012, 3 pages.
Chen Q. et al. Application of Surface Plasmon Polaritons in CMOS Digital Imaging, InTech, Oct. 24, 2012, 28 pages.
Chen Q. et al., High transmission and low color cross-talk plasmonic color filters using triangular-lattice hole arrays in aluminum films, Optics Express, vol. 18, No. 13, Jun. 21, 2010, 7 pages.
Cheng et al., Structural color printing based on plasmonic metasurfaces of perfect light absorption, Scientific Reports, vol. 5, Jun. 5, 2015, 10 pages.
Ghosh et al., Improvement on the Performance of InP/CdS Solar Cells with the Inclusion of Plasmonic Layer of Silver Nanoparticles, Plasmonics, vol. 9, Jun. 1, 2014, 11 pages.
Konstantatos et al., Nanostructured materials for photon detection, Nature Nanotechnology, vol. 5, May 16, 2010, 10 pages.
Lin et al. Nanostructured materials for photon detection, Applied Physics Letters 97, Aug. 12, 2010, 3 pages.
Lyu et al., Plasmonic color filters to decrease ambient light errors on active type dual band infrared image sensors, Proceedings of SPIE, vol. 9160, 2014, 7 pages.
Mailhes et al., Plasmon-induced enhancement of optical absorption in silicon thin films due to embedded silver nano-pillars, EPL 108, Dec. 2014, 5 pages.
Petefish, Nanostructured surfaces for surface plasmon resnonance spectroscopy and imaging, 2014, 166 pages.
Stalmashonak et al., Optical Properties of Nanocomposites Containing Metal Nanoparticles, 2013, 12 pages.
Tsuboi et al., Multicolor Electrochromism Showing Three Primary Color States (Cyan-Magenta-Yellow) Based on Size- and Shape-Controlled Silver Nanoparticles, Chemistry of Materials, 2014, 9 pages.
Wang et al., Ag surface plasmon enhanced double-layer antireflection coatings for GaAs solar cells, Journal of Semiconductors, vol. 30, No. 7, Jul. 2009, 5 pages.
Yokogawa et al., Plasmonic Color Filters for CMOS Image Sensor Applications, NANO Letters, Jun. 5, 2012, 6 pages.
Yu et al., Transmissive/Reflective Structural Color Filters: Theory and Applications, Journal of Nanomaterials, vol. 2014, 17 pages.
Zhang et al., Near-infrared optical absorption enhanced in black silicon via Ag nanoparticle-induced localized surface plasmon, Nanoscale Research Letters, 2014, 5 pages.
Kottmann et al., Plasmon resonances of silver nanowires with a nonregular cross section, Physical Review B, vol. 64, 2001, 10 pages.
Office Action corresponding to Taiwanese Patent Application No. 105140614, dated Jun. 20, 2017.
Office Action with English Translation corresponding to Taiwanese Patent Application No. 105140614, dated Oct. 19, 2017, 7 pages.
English Translation of Office Action, Taiwanese Patent Application No. 106146029, dated Oct. 8, 2018, 3 pages.
Office Action, Taiwanese Patent Application No. 106146029, dated Oct. 8, 2018, 6 pages.

* cited by examiner

PLASMONIC-NANOSTRUCTURE SENSOR PIXEL

BACKGROUND

The development of low-cost complementary metal-oxide semiconductor (CMOS) image sensors has contributed to the incorporation of color camera modules in high-volume consumer products such as mobile devices and motor vehicles. Advances in such camera modules include incorporation of infrared (IR) detection capability, and hence dual mode imaging of both visible and infrared spectral bands, which are important for applications such as gesture recognition and depth analysis.

Herein the terms IR light, IR electromagnetic radiation, and IR wavelengths refer to electromagnetic energy at wavelengths between $\lambda \approx 0.75$ μm and $\lambda \approx 1.1$ μm. The upper limit of $\lambda \approx 1.1$ μm corresponds to the band gap energy of silicon in CMOS image sensors. Similarly, the terms visible light, visible electromagnetic radiation, and visible wavelengths refer to electromagnetic energy at wavelengths between 0.40 μm and 0.75 μm.

FIG. 1 shows a camera module 120 of a mobile device 190. FIG. 2 is a cross-sectional view of camera module 120. Camera module 120 includes an imaging lens 222 and image sensor 250 having a pixel array 200. Imaging lens 222 is capable of imaging light 232 propagating from an object 234 onto pixel array 200. Image sensor 250 may include a device die 206 that is, for example, implemented using CMOS processes, but may be implemented in other technologies without departing from the scope hereof. Device die 206 is electrically connected to a printed circuit board (PCB) 230.

FIG. 3 is a cross-sectional view of a prior-art IR-sensitive pixel 300 compatible for use in pixel array 200. IR-sensitive pixel 300 includes an IR band-pass filter 374 between a microlens 376 and a silicon substrate 320. Substrate 320 includes photodiode regions 322 and is formed of a semiconductor such as silicon. Substrate 320 may include layers and regions of different materials without negating its function as a substrate for filter 374.

A problem with IR-sensitive pixel 300 is that silicon substrate 320 absorbs infrared light much less efficiently that it does visible light. The electric field of light incident on a medium surface decays within the medium to $e^{-1}$ of its initial value at a distance $$z(\lambda) = \frac{\lambda}{2\pi\kappa(\lambda)}$$

from the surface, where $\kappa(\lambda)$ is the imaginary part of the medium's refractive index at wavelength $\lambda$. For silicon, $\kappa(\lambda)$ at $\lambda=500$ nm (green light) is more than ten times that of $\kappa(\lambda)$ at $\lambda=830$ nm (near-IR), which means that, compared to visible light, IR light propagates roughly ten times further into silicon before being absorbed. This decreased absorption of IR light limits the sensitivity of pixel array 200 to IR light as compared to visible light.

SUMMARY OF THE INVENTION

In a first embodiment, a plasmonic-nanostructure sensor pixel includes a semiconductor substrate and a plurality of metal pillars. The semiconductor substrate has a top surface and a photodiode region therebeneath. The plurality of metal pillars is at least partially embedded in the substrate and extends from the top surface in a direction substantially perpendicular to the top surface.

In a second embodiment, a plasmonic-nanostructure sensor pixel includes (a) a semiconductor substrate having a top surface, (b) an oxide layer on the top surface, (c) a thin-film coating between the top surface and the oxide layer, and (d) a plurality of metal nanoparticles (i) at least partially between the top surface and the oxide layer and (ii) at least partially embedded in at least one of the thin-film coating and the oxide layer.

A third embodiment of a plasmonic-nanostructure sensor pixel includes features of the first embodiment and the second embodiment.

DETAILED DESCRIPTION OF THE EMBODIMENTS

Figure 1:
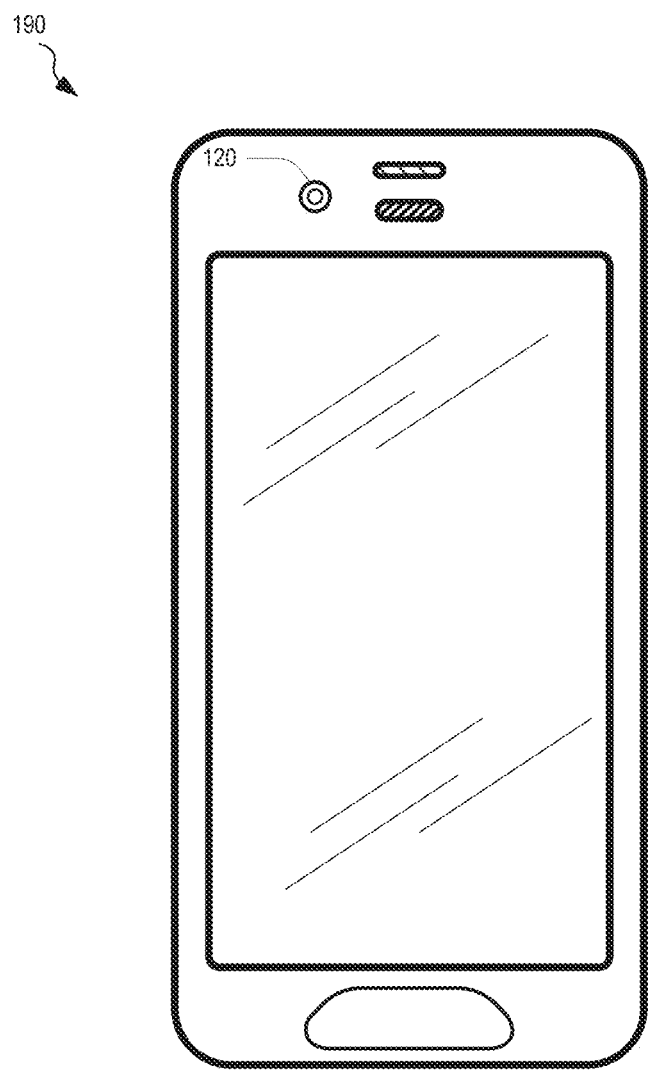
FIG. 1 shows a mobile device that includes a camera module.
Figure 2:
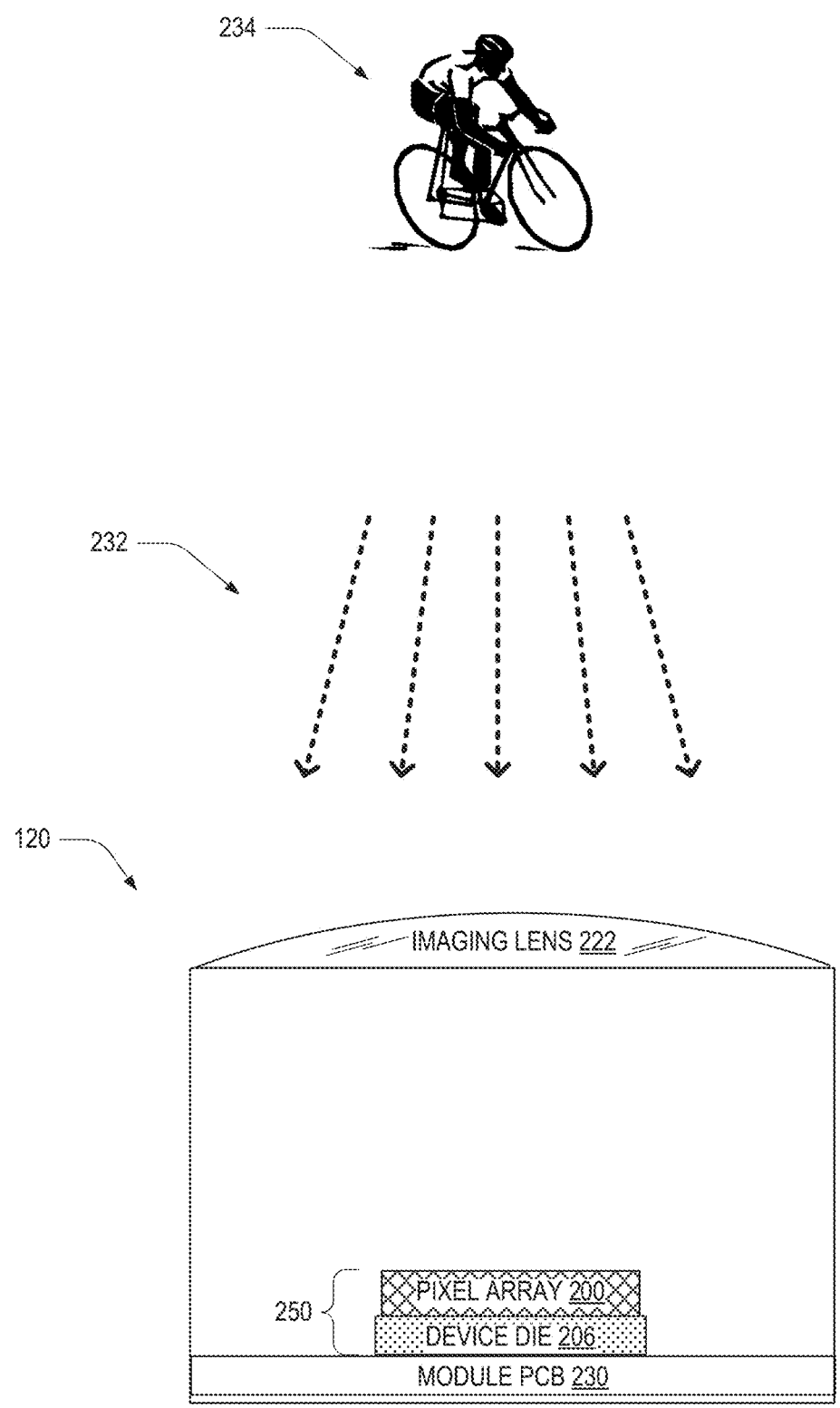
FIG. 2 is a cross-sectional view of the camera module of FIG. 1 that includes an image sensor having a pixel array.
Figure 3:
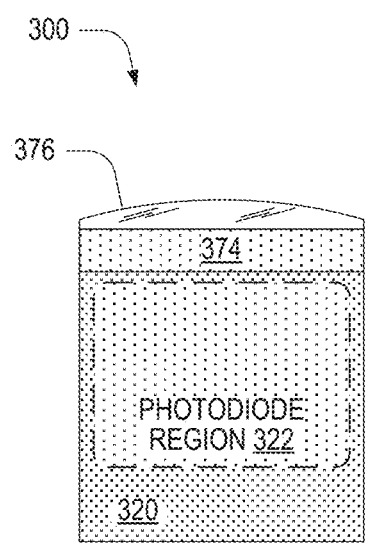
FIG. 3 is a cross-sectional view of a prior-art IR-sensitive pixel of the pixel array of FIG. 2.
Figure 4A:
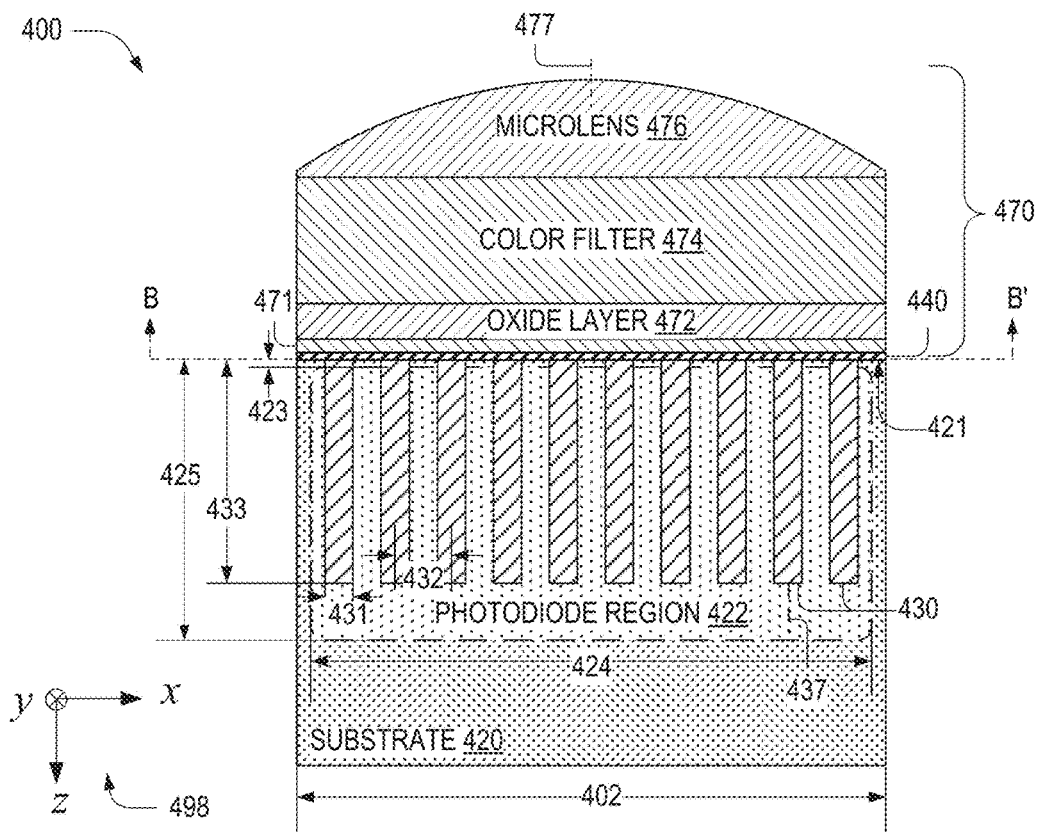
FIGS. 4A and 4B are cross-sectional views of a plasmonic-nanostructure sensor pixel, in an embodiment.
Figure 4B:
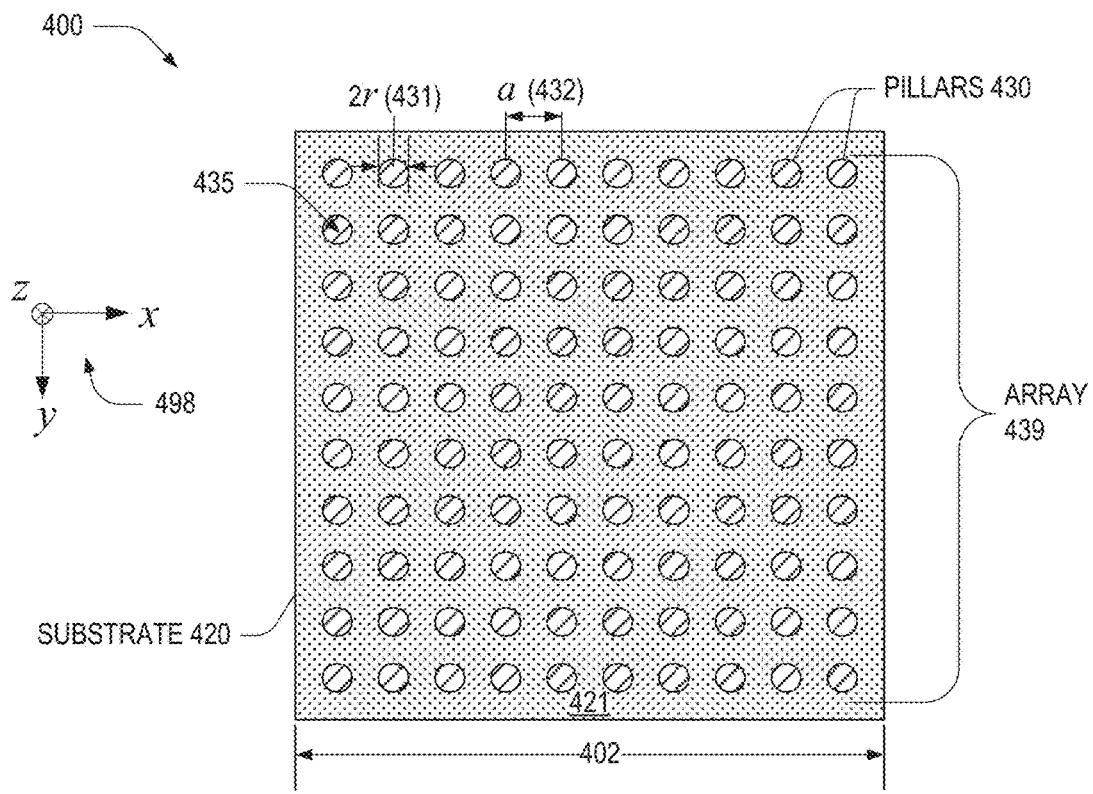

FIGS. 4A and 4B are cross-sectional views of a plasmonic-nanostructure sensor pixel 400. Plasmonic-nanostructure sensor pixel 400 is compatible for use in pixel array 200. The cross-sectional view of FIG. 4A is in the x-z plane of a coordinate system 498. The cross-sectional view of FIG. 4B is along cross-section B-B' of FIG. 4A and in the x-y plane of a coordinate system 498. Plasmonic-nano structure sensor pixel 400 includes a plurality of metal pillars 430 in a substrate 420 arranged in an array 439.

Substrate 420 is formed of a semiconductor such as silicon, and may include layers and regions of different materials without departing from the scope hereof. Metal pillars 430 may be formed of a noble metal such as aluminum, gold, silver, platinum, and copper, or an alloy thereof. Substrate 420 has a top surface 421, which may be planar as illustrated in FIG. 4A, or non-planar.

Plasmonic-nanostructure sensor pixel 400 may also include at least one of an insulating layer 440 and an optics unit 470. Optics unit 470 includes at least one of an anti-reflective (AR) coating 471, an oxide layer 472, a color filter 474, and a microlens 476, as shown in FIG. 4A. Color filter 474 is for example an IR band-pass filter. Insulating layer 440 is for example hafnium(IV) oxide layer having a thickness between 5 nm and 10 nm.

Microlens 476 has an optical axis 477 and each pillar 430 has a longitudinal axis 437. Longitudinal axis 437 of each pillar 430 may be parallel with optical axis 477, as shown in FIG. 4A. Alternatively, longitudinal axis 437 of a pillar 430 may be substantially parallel to optical axis 477, where herein substantially parallel indicates that longitudinal axis 437 and optical axis 477 deviate from parallelism by less than five degrees. In such embodiments, longitudinal axis 437 is substantially perpendicular to surface 421 of substrate 420. Alternatively, longitudinal axis 437 may deviate from being perpendicular to intersect surface 421 by more than five degrees.

AR coating 471 is for example a tantalum pentoxide layer having a thickness t between 55 nm and 60 nm. Tantalum pentoxide can be formed as an amorphous thin film and has a refractive index of n=2.1 at λ=900 nm. AR coating 471 may be crystalline with departing from the scope hereof.

Array 439 is a square array with a pillar spacing a=400 nm (hereinafter "pillar spacing 432") and each metal pillar 430 has a pillar diameter 2r=150 nm (hereinafter "pillar diameter 431") such that array 439 has an area fill-factor $f=\pi r^2/a^2=0.11$. Pillar diameter 431 may be between 80 nm and 250 nm and corresponding area fill-factor f may be between 0.030 and 0.31 without departing from the scope hereof. An advantage of metal pillars having a 150-nm diameter (or more generally, a width) compared to a significantly smaller diameter, e.g., less than 80-nm, is that pillars with larger radii enable higher yields in current CMOS foundry processes than do pillars with smaller widths.

Without departing from the scope hereof, pillar diameter 431 and pillar spacing 432 may have different values, and array 439 a different type of periodic array, such a hexagonal array or a rectangular array, or a non-periodic array. Metal pillars 430 have a circular cross-section as shown in FIG. 4B. Metal pillars 430 may have a non-circular cross-section, such as elliptical, polygonal, or that of a Jordan curve, without departing from the scope hereof. Herein, a polygonal cross-section includes polygons with one or more rounded corners.

Substrate 420 includes a photodiode region 422 that has a photodiode width 424. In the z direction of coordinate system 498, photodiode region 422 begins at distance 423, and ends at a distance 425, from top surface 421 of substrate 420. Distance 423 may equal zero such that at least part of top surface 421 is a surface of photodiode region 422.

Pillars 430 extend a distance 433 into substrate 420 from top surface 421. Distance 433 is for example between 1.0 μm and 2.5 μm. At least one pillar 430 may have a top surface 435 that is coplanar with top surface 421, as shown in FIGS. 4A and 4B. Alternatively, a pillar 430 may be entirely beneath surface 421, such that it is completely embedded within substrate 420. A pillar 430 may be partially embedded in substrate 420 such that a portion of the pillar 430 protrudes above surface 421 into insulating layer 440 and optionally into one or more components of optics unit 470.

FIG. 4A shows distance 433 as exceeding distance 423 such that at least one pillar 430 extends into photodiode region 422. Distance 433 may also exceed distance 425 such that at least one pillar 430 extends through photodiode region 422. Alternatively, distance 423 may exceed distance 433, such that no pillars 430 extend into photodiode region 422.

FIG. 4A shows photodiode width 424 as exceeding pillar spacing 432. Alternatively, photodiode width 424 may be less than pillar spacing 432. Pillars 430 may have equal lengths, as illustrated in FIG. 4A, or may have different lengths, for example, as a function of distance from optical axis 477 in a plane parallel to the x-y plane of coordinate system 498.

For illustrative purposes, FIG. 4A shows plasmonic-nanostructure sensor pixel 400 having a pixel width 402 that spans ten pillars 430 (pixel width 402 exceeds 10a) and having one photodiode region 422 having a photodiode width 424 that spans each pillar 430. Pixel width 402 and photodiode width 424 may be different sizes relative to pillar spacing 432. For example, pixel width 402 may be between 1.0 μm and 3.0 μm.

Figure 5:
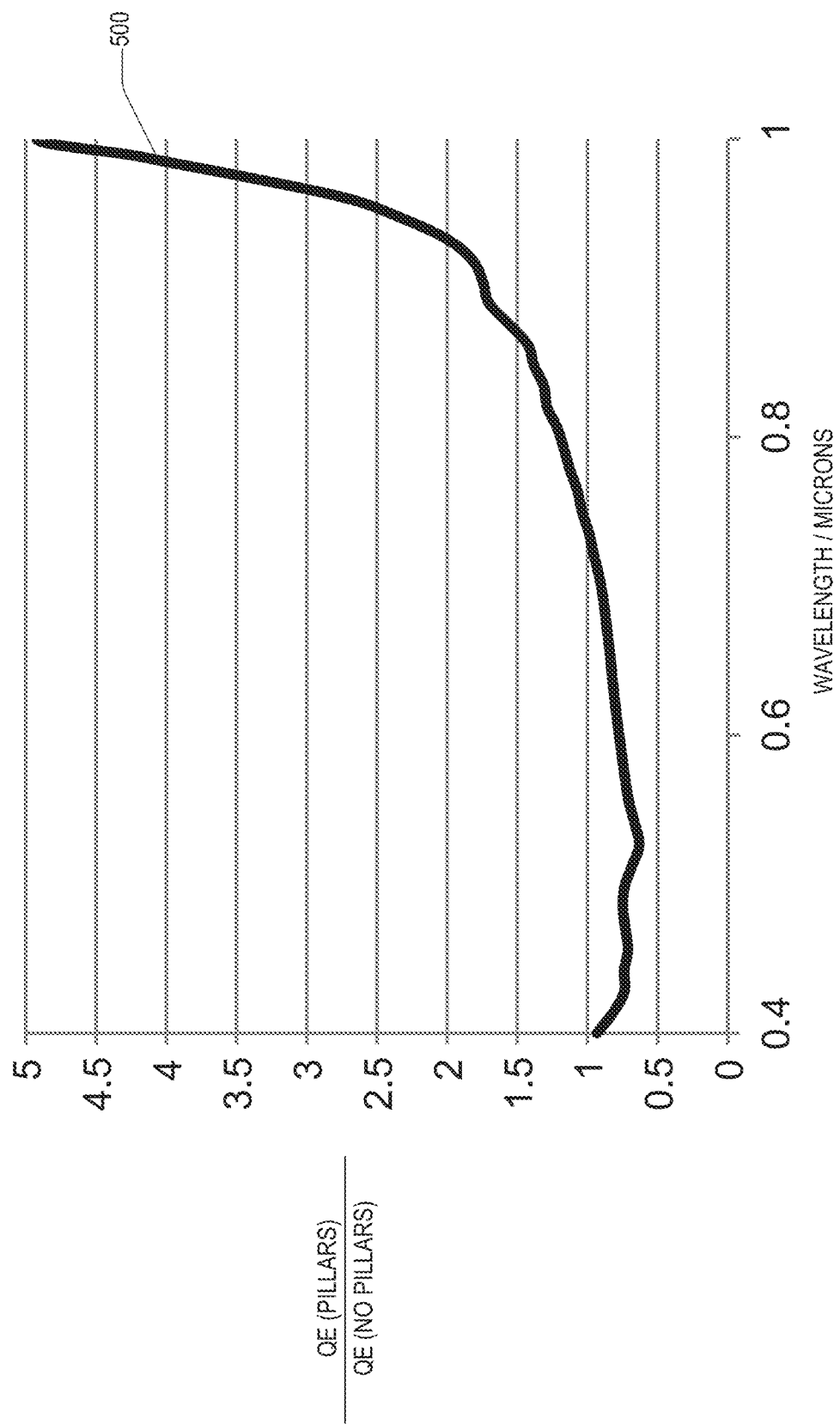
FIG. 5 shows simulated normalized quantum efficiency of an embodiment of the plasmonic-nanostructure sensor pixel of FIGS. 4A and 4B.

FIG. 5 is a plot of a normalized quantum efficiency 500 of an embodiment plasmonic-nanostructure sensor pixel 400 that lacks color filter 474 and wherein metal pillars 430 are aluminum. Normalized quantum efficiency 500 is a simulated quantum efficiency of plasmonic-nanostructure sensor pixel 400 divided by a simulated quantum efficiency of a pixel identical to pixel 400, but with no metal pillars. That is, metal pillars 430 are replaced with silicon. Normalized quantum efficiency 500 is computed using a finite-difference time-domain (FDTD) software package. In the wavelength range shown in FIG. 5, normalized quantum efficiency 500 exceeds unity at wavelengths longer than 740 nm. The enhanced quantum efficiency results at least partially from the coupling of IR light incident on top surface 421 into plasmons propagating on surfaces of pillars 430.

Figure 6:
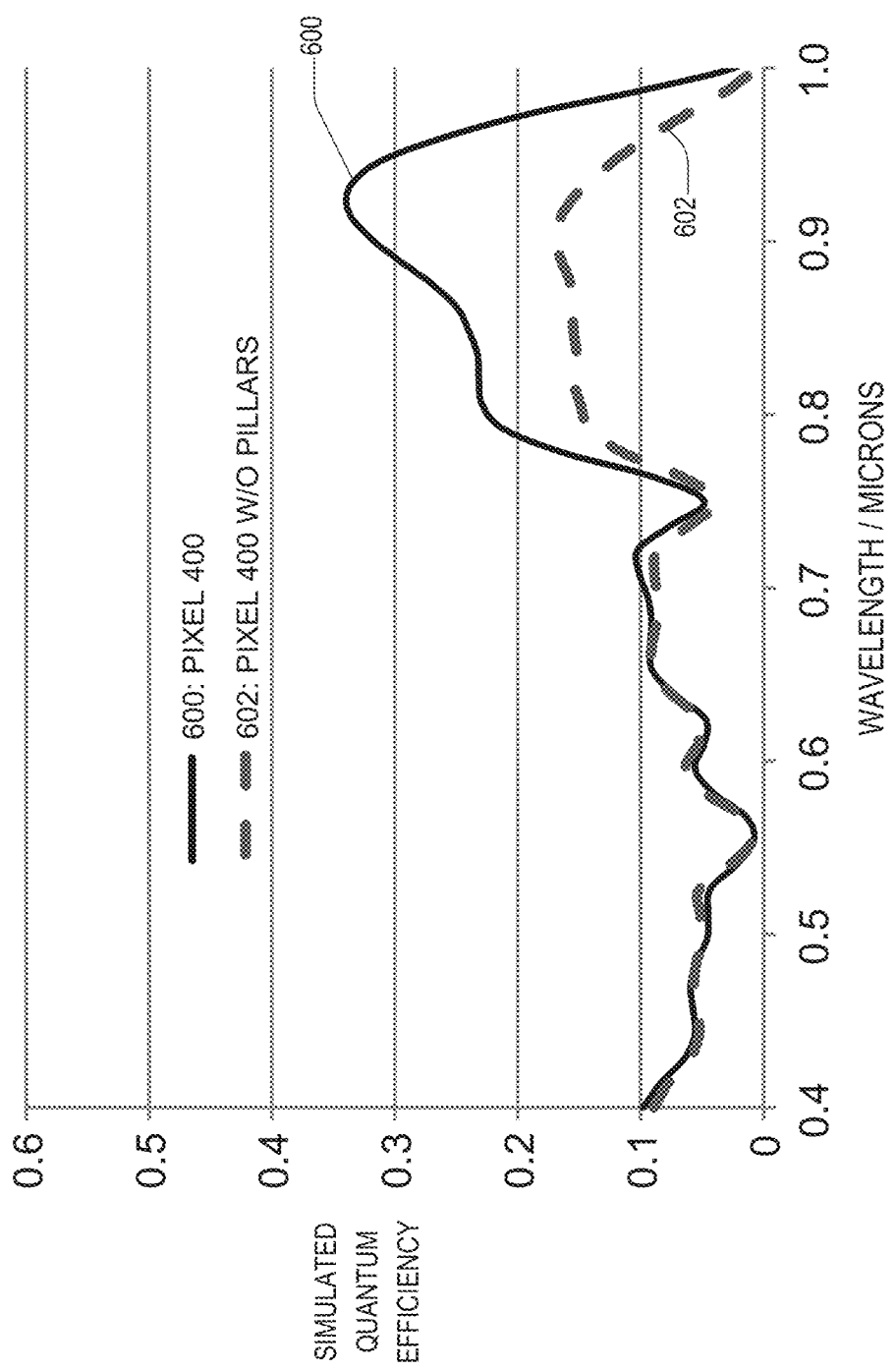
FIG. 6 shows simulated quantum efficiency of an embodiment of the plasmonic-nanostructure sensor pixel of FIGS. 4A and 4B.

FIG. 6 is a plot of a quantum efficiency 600 of an embodiment plasmonic-nanostructure sensor pixel 400 as shown in FIG. 4 wherein metal pillars 430 are aluminum. Quantum efficiency 602 is the quantum efficiency of a pixel identical to pixel 400, except that it lacks metal pillars 430. Quantum efficiency 600 exceeds quantum efficiency 602 at wavelengths longer than approximately 0.74 μm. Quantum efficiencies 600 and 602 are computed with an FDTD software package.

Figure 7A:
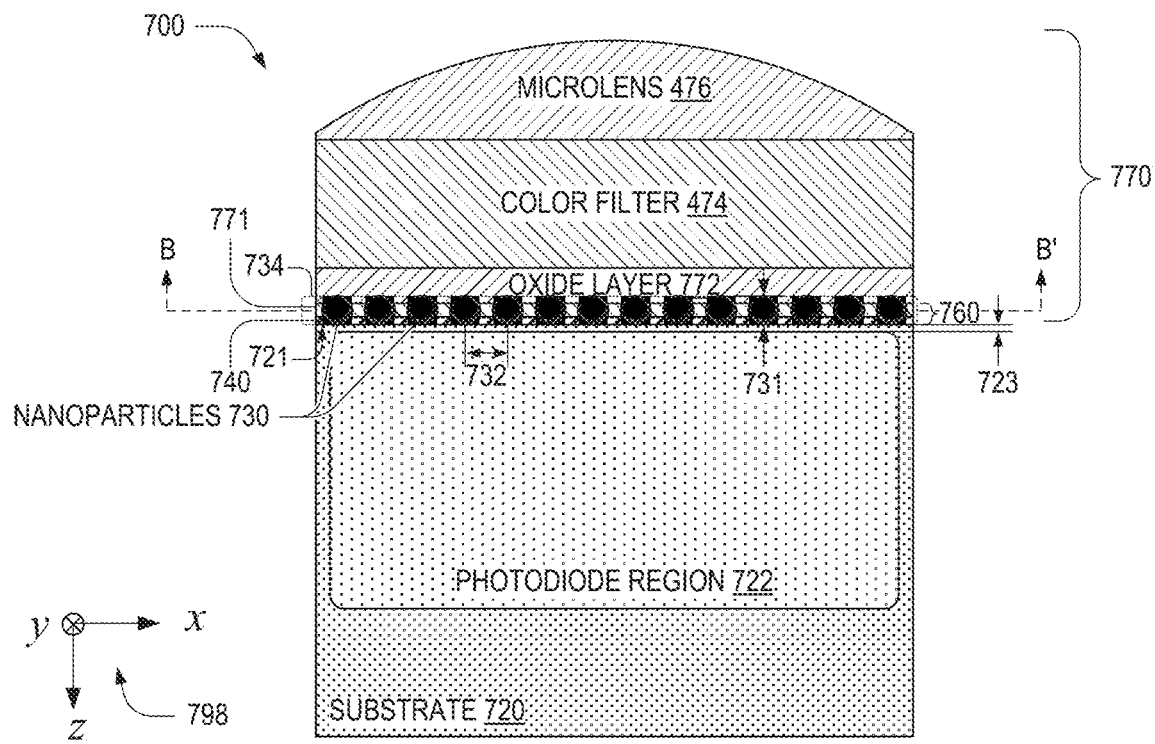
FIGS. 7A and 7B are cross-sectional views of a plasmonic-nanostructure sensor pixel, in an embodiment.
Figure 7B:
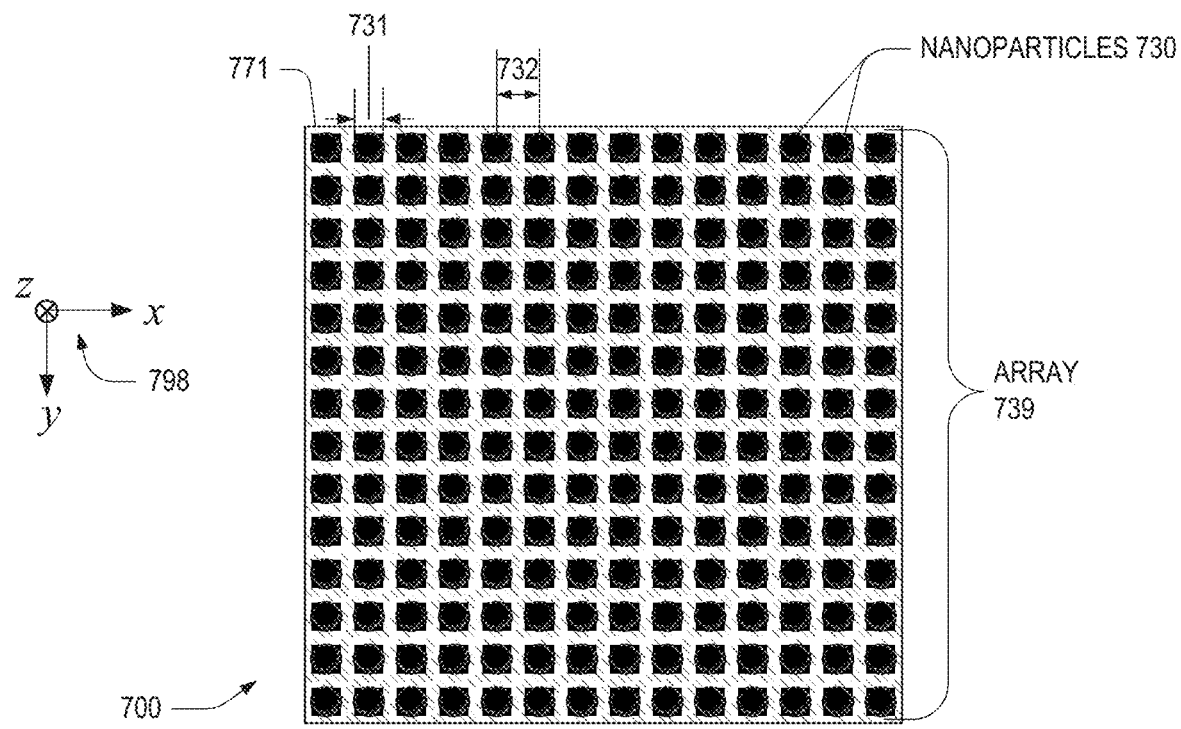

FIGS. 7A and 7B are cross-sectional views of a plasmonic-nanostructure sensor pixel 700. Plasmonic-nanostructure sensor pixel 700 is compatible for use in pixel array 200. The cross-sectional view of FIG. 7A is in the x-y plane of a coordinate system 798. The cross-sectional view of FIG. 7B is along cross-section 7B-7B' of FIG. 7A and parallel to the x-y plane of coordinate system 798. Plasmonic-nanostructure sensor pixel 700 includes a plurality of metal nanoparticles 730 on a surface 721 of a substrate 720. Metal nanoparticles 730 are embedded in a coating 760 and oxide layer 472 and arranged in an array 739, shown in FIG. 7B as a planar square array. Plasmonic-nanostructure sensor pixel 700 may also include at least one of color filter 474 and microlens 476, as shown in FIG. 7A. An oxide layer 772, a color filter 474, and a microlens 476 are part of an optics unit 770.

Substrate 720 includes a photodiode region 722 that is a distance 723 from top surface 721. Distance 723 may equal zero such that at least part of surface 721 is a surface of photodiode region 722. Surface 721 may be planar as illustrated in FIG. 7A, or be a non-planar surface without departing from the scope hereof.

Coating 760 may include more than one layer, as shown in FIG. 7A, where coating 760 includes an insulating layer 740 and an AR coating 771, which, absent nanoparticles 730 embedded therein, are similar to insulating layer 440 and AR coating 471, respectively. AR coating 771 is part of optics unit 770 and cross-section 7B-7B' is through AR coating 771. Herein nanoparticles 730 are not considered as part of layer 740, coating 771, or coating 760. Coating 760 may be a single homogeneous layer without departing from the scope hereof.

Array 739 is a square array with a particle spacing 732 equal to 0.30 μm and each metal nanoparticle 730 has a diameter 731 equal to 0.1 μm. Within a volume 734 above surface 721 having a height equal to diameter 731, nanoparticles 730 have a volume fill factor equal to six percent. The volume fill factor may differ from six percent without departing from the scope hereof. Diameter 731 may be between 0.1 μm and 0.4 μm. Metal nanoparticles 730 are spherical as shown in FIGS. 7A and 7B such that diameter 731 corresponds to a height of metal nanoparticles 730 above surface 721.

Metal nanoparticles 730 may be formed of a noble metal such as aluminum, gold, silver, platinum, and copper, or an alloy thereof. Diameter 731 and particle spacing 732 may have different values, and array 739 a different type of periodic array, such a hexagonal array or a rectangular array, or a non-periodic array. One or more metal nanoparticles 730 may be non-spherical, for example, metal nanoparticle 730 may be one of ellipsoidal, cylindrical, capsule-shaped, and disc-shaped (e.g., like a hockey puck).

Figure 8:
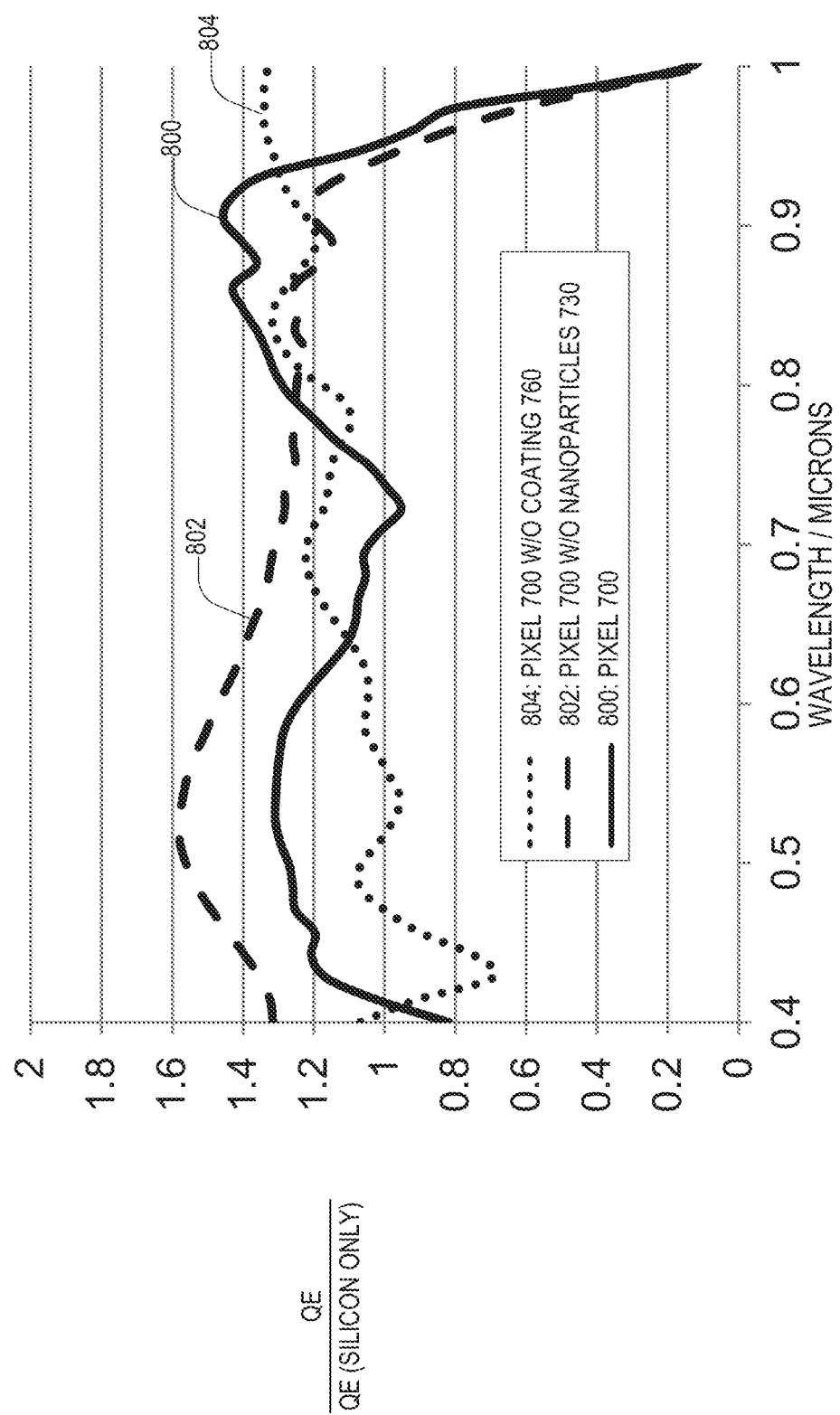
FIG. 8 is a plot of a normalized quantum efficiency of an embodiment of plasmonic-nanostructure sensor pixel of FIGS. 7A and 7B.

FIG. 8 is a plot of a normalized quantum efficiency 800 of plasmonic-nanostructure sensor pixel 700 wherein metal nanoparticles 730 are formed of aluminum. FIG. 8 also shows normalized quantum efficiencies 802 and 804. Normalized quantum efficiency 802 corresponds to response of plasmonic-nanostructure sensor pixel 700 without nanoparticles 730. Normalized quantum efficiency 804 corresponds to response of plasmonic-nanostructure sensor pixel 700 without coating 760. Normalized quantum efficiencies 800, 802, and 804 are computed using FDTD Solutions and normalized by a simulated quantum efficiency of a pixel identical to pixel 700 that has neither metal nanoparticles 730 nor coating 760. In the wavelength range shown in FIG. 8, normalized quantum efficiency 800 exceeds unity at wavelengths between approximately 0.74 μm and 0.95 μm. The enhanced quantum efficiency results in part from the coupling of IR light propagating though coating 760 into surface plasmons propagating on metal nanoparticles 730.

Figure 9:
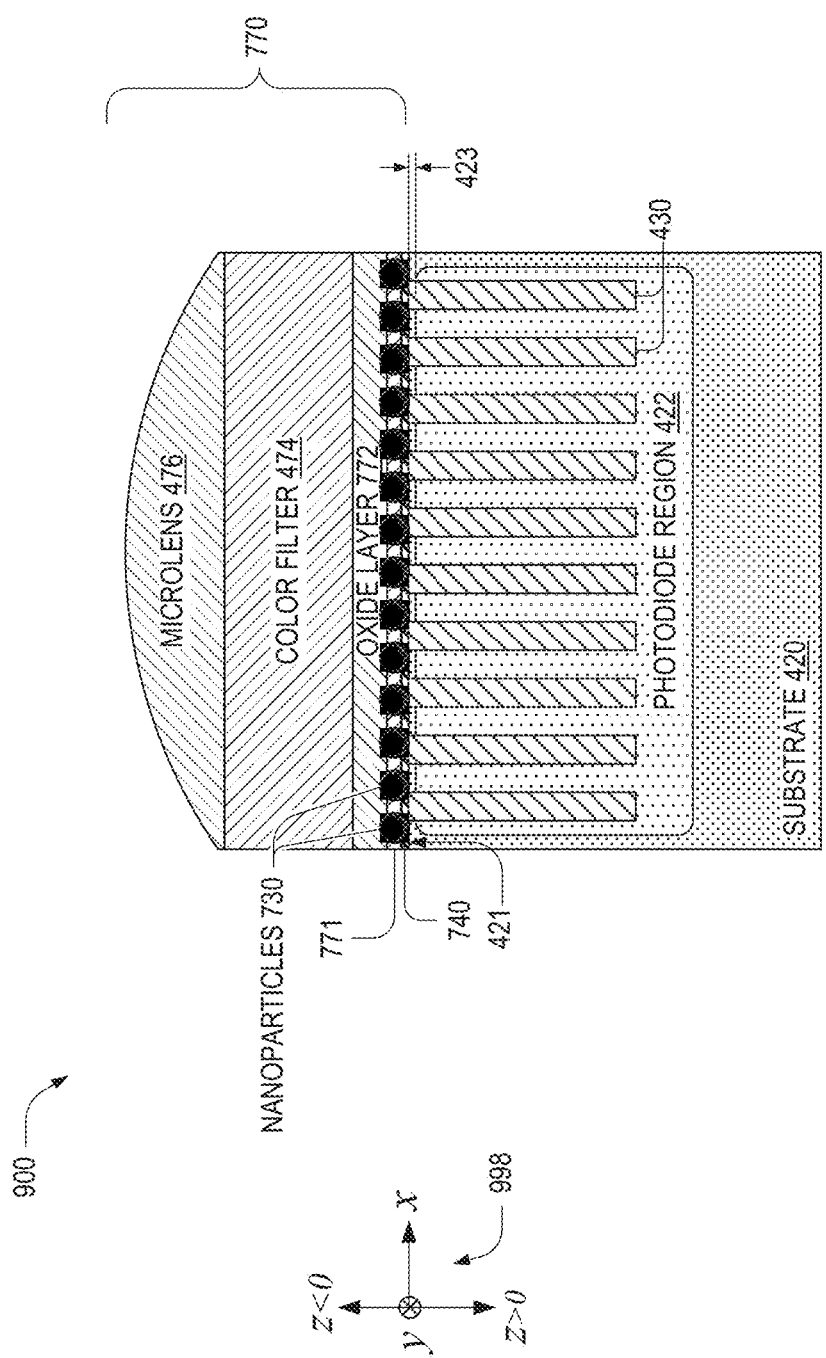
FIG. 9 is a cross-sectional view a plasmonic-nanostructure sensor pixel, in an embodiment.

A plasmonic-nanostructure sensor pixel may include both metal pillars 430 of pixel 400 (FIG. 4) and metal nanoparticles 730 of pixel 700 (FIG. 7). For example, FIG. 9 is a cross-sectional view a plasmonic-nanostructure sensor pixel 900. Plasmonic-nanostructure sensor pixel 900 is compatible for use in pixel array 200. Pixel 900 includes substrate 420 with its top surface 421 in the x-y plane of a coordinate system 998. On the positive side of the x-y plane (z>0), pixel 900 is identical to pixel 400. On the negative side of the x-y plane (z<0), pixel 900 is identical to pixel 700. In pixel 900, distance 423 and size and pitch of pillars 430 and nanoparticles 730 may be jointly optimized to increase quantum efficiency for light in a particular spectral region, such as the near-IR spectral region.

Features described above as well as those claimed below may be combined in various ways without departing from the scope hereof. The following examples illustrate some possible, non-limiting combinations:

(A1) A plasmonic-nanostructure sensor pixel includes a semiconductor substrate and a plurality of metal pillars. The semiconductor substrate has a top surface and a photodiode region therebeneath. The plurality of metal pillars is at least partially embedded in the substrate and extends from the top surface in a direction substantially perpendicular to the top surface.

(A2) The pixel denoted by (A1) may further include, on the top surface, an optics unit including at least one of an anti-reflective coating, an oxide layer, a color filter, and a microlens (A3) In a pixel denoted by one of (A1) and (A2), a top surface of one of the plurality of pillars may be coplanar with the top surface of the substrate (A4) In a pixel denoted by one of (A1) through (A3), at least a portion of each pillar may be in the photodiode region (A5) In a pixel denoted by one of (A1) through (A4), each of the plurality of pillars may have a minimum width exceeding fifty nanometers and a maximum width less than one micrometer.

(A6) In a pixel denoted by one of (A1) through (A5), the plurality of pillars each may have a top end proximate the top surface and a bottom end opposite the top end and located within the substrate. A distance between the top end and the bottom end may be between one micrometer and three micrometers (A7) In a pixel denoted by one of (A1) through (A6), the plurality of pillars may form a periodic array.

(A8) In a pixel denoted by (A7), the array may have an area fill-factor between 0.030 and 0.31.

(A9) In a pixel denoted by one of (A1) through (A8), one of the plurality of pillars may have, in a plane parallel to the to the surface of the substrate, a non-circular cross-sectional shape.

(A10) In a pixel denoted by one of (A1) through (A9), each of the plurality of pillars may be formed of one or more materials selected from the group consisting of aluminum, gold, silver, platinum, and copper.

(A11) A pixel denoted by one of (A1) through (A10) may further include (a) an oxide layer on the top surface, (b) a thin-film coating between the top surface and the oxide layer, and (c) a plurality of metal nanoparticles (i) at least partially between the top surface and the oxide layer and (ii) at least partially embedded in at least one of the thin-film coating and the oxide layer.

(B1) A plasmonic-nanostructure sensor pixel includes (a) a semiconductor substrate having a top surface, (b) an oxide layer on the top surface, (c) a thin-film coating between the top surface and the oxide layer, and (d) a plurality of metal nanoparticles (i) at least partially between the top surface and the oxide layer and (ii) at least partially embedded in at least one of the thin-film coating and the oxide layer.

(B2) The pixel denoted by (B1) may further include, on a side of the oxide layer opposite the thin-film coating, at least one of a color filter and a microlens.

(B3) In a pixel denoted by one of (B1) and (B2), the plurality of metal nanoparticles may be partially embedded in both the thin-film coating and the oxide layer.

(B4) In a pixel denoted by one of (B1) through (B3) wherein the thin-film coating includes multiple layers, the plurality of nanoparticles may be embedded in one of the multiple layers and may protrude through opposite sides thereof.

(B5) In a pixel denoted by (B4), the plurality of nanoparticles may be partially embedded in each of the multiple layers and the oxide layer.

(B6) In a pixel denoted by one of (B1) through (B5), the top surface of semiconductor substrate may be planar.

(B7) In a pixel denoted by one of (B1) through (B6), at least one of the nanoparticles may be disc-shaped.

(B8) In a pixel denoted by one of (B1) through (B7), each of the plurality of nanoparticles may be formed of one or more materials selected from the group consisting of aluminum, gold, silver, platinum, and copper.

(B9) A pixel denoted by one of (B1) through (B8) may further include a plurality of metal pillars at least partially embedded in the substrate and extending from the top surface in a direction substantially perpendicular to the top surface.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A plasmonic-nanostructure sensor pixel, comprising:
a semiconductor substrate having a top surface and a photodiode region therebeneath; and
a plurality of metal pillars at least partially embedded in the semiconductor substrate and extending from the top surface of the semiconductor substrate in a direction substantially perpendicular to the top surface.

2. The pixel of claim 1, further comprising, on the top surface, an optics unit including at least one of an anti-reflective coating, an oxide layer, a color filter, and a microlens.

3. The pixel of claim 1, a top surface of one of the plurality of pillars being coplanar with the top surface of the substrate.

4. The pixel of claim 1, at least a portion of each pillar being in the photodiode region.

5. The pixel of claim 1, each of the plurality of pillars having a minimum width, in a dimension parallel to the top surface, exceeding fifty nanometers and a maximum width less than one micrometer.

6. The pixel of claim 1, each of the plurality of pillars each having a top end proximate the top surface and a bottom end opposite the top end and located within the substrate, a distance between the top end and the bottom end being between one micrometer and three micrometers.

7. The pixel of claim 1, the plurality of pillars forming a periodic array.

8. The pixel of claim 7, the array having an area fill-factor between 0.030 and 0.31.

9. The pixel of claim 1, one of the plurality of pillars having, in a plane parallel to the top surface of the semiconductor substrate, a non-circular cross-sectional shape.

10. The pixel of claim 1, each of the plurality of pillars being formed of one or more materials selected from the group consisting of aluminum, gold, silver, platinum, and copper.

11. The pixel of claim 1, further comprising:
an oxide layer on the top surface;
a thin-film coating between the top surface and the oxide layer;
a plurality of metal nanoparticles (i) at least partially between the top surface and the oxide layer and (ii) at least partially embedded in at least one of the thin-film coating and the oxide layer.

12. A plasmonic-nanostructure sensor pixel, comprising:
a semiconductor substrate having a top surface;
an oxide layer on the top surface;
a thin-film coating between the top surface and the oxide layer;
a plurality of metal nanoparticles (i) at least partially between the top surface and the oxide layer and (ii) at least partially embedded in at least one of the thin-film coating and the oxide layer.

13. The pixel of claim 12, further comprising, on a side of the oxide layer opposite the thin-film coating, at least one of a color filter and a microlens.

14. The pixel of claim 12, each of the plurality of metal nanoparticles being partially embedded in both the thin-film coating and the oxide layer.

15. The pixel of claim 12, the thin-film coating including multiple layers, the plurality of nanoparticles being embedded in one of the multiple layers and protruding through opposite sides thereof.

16. The pixel of claim 15, each of the plurality of nanoparticles being partially embedded in each of the multiple layers and the oxide layer.

17. The pixel of claim 12, the top surface of semiconductor substrate being planar.

18. The pixel of claim 12, at least one of the nanoparticles being disc-shaped.

19. The pixel of claim 12, each of the plurality of nanoparticles being formed of one or more materials selected from the group consisting of aluminum, gold, silver, platinum, and copper.

20. The pixel of claim 12, further comprising a plurality of metal pillars at least partially embedded in the substrate and extending from the top surface in a direction substantially perpendicular to the top surface.

21. The pixel of claim 12, each of the plurality of metal nanoparticles being in direct contact with the top surface of the semiconductor substrate.

* * * * *